United States Patent [19]

Hatakeyama et al.

[11] Patent Number: 5,375,032
[45] Date of Patent: Dec. 20, 1994

[54] TRIP CONTROL DEVICE FOR CIRCUIT BREAKER

[75] Inventors: Yoshihiro Hatakeyama; Yoshiyuki Fujisawa, both of Fukuyama, Japan

[73] Assignee: Mitsubishi Denki Kabushiki Kaisha, Tokyo, Japan

[21] Appl. No.: 966,445

[22] Filed: Oct. 26, 1992

[30] Foreign Application Priority Data

Nov. 11, 1991 [JP] Japan .................. 3-294382

[51] Int. Cl.⁵ .............................. H02H 3/20
[52] U.S. Cl. .......................... 361/187; 361/86
[58] Field of Search ............. 361/86, 88, 89, 90, 361/91, 92, 139, 160, 170, 187, 195

[56] References Cited

U.S. PATENT DOCUMENTS

| | | | |
|---|---|---|---|
| 4,707,760 | 11/1987 | Allos | 361/90 |
| 4,879,625 | 11/1989 | Potenzone | 361/90 |
| 4,918,562 | 4/1990 | Pulizzi et al. | 361/86 |
| 4,999,730 | 3/1991 | Pickard | 361/59 |

FOREIGN PATENT DOCUMENTS 0381131 8/1990 European Pat. Off. .
2139436 11/1984 United Kingdom .

*Primary Examiner*—Jeffrey A. Gaffin
*Attorney, Agent, or Firm*—Burns, Doane, Swecker & Mathis

[57] ABSTRACT

A trip control device for monitoring and tripping a circuit breaker includes a first voltage detector 11 and a second voltage detector 12 for detecting the first and second reference voltages corresponding to the maximum allowable voltage level and the operation resumable voltage level, wherein the second reference voltage is set higher than the first reference voltage. The output of the second voltage detector 12 at logical 1 reduces the output of the first voltage detector 11 to the logical 0 through a transistor 14 and a capacitor 15 with a predetermined delay. The logical sum T of the outputs of the first voltage detector 11 and the second voltage detector 12, output from the OR gate 13, turns off the drive circuit 3 when at logical 0, to de-energize the electromagnetic coil 4 and render the associated circuit breaker incapable of being made.

2 Claims, 3 Drawing Sheets

TRIP CONTROL DEVICE FOR CIRCUIT BREAKER

BACKGROUND OF THE INVENTION

This invention relates to trip control devices for monitoring the voltage applied on the circuit breakers and to trip the circuit breakers and thereby to protect the voltage source and the loads. More particularly, this invention relates to such trip control devices which render the circuit breakers incapable of being made and closed when the controlled voltage such as the source voltage exhibit abnormal levels due to overvoltage.

FIG. 3 is a circuit diagram showing a conventional trip control device, which is disclosed, for example, in Japanese Utility Model Publication (Kokoku) No. 58-18441. When the source voltage becomes less than a predetermined level, the electromagnetic coil is de-energized to effect the tripping control of the circuit breaker. The AC voltage supplied from a controlled power source 1 such as a generator is rectified by a full-wave rectifier 2 consisting of a diode bridge circuit. The negative terminal of the full-wave rectifier 2 is grounded, while the positive terminal thereof supplies the controlled voltage $V_0$ to the respective circuit components.

A PNP type transistor 3 having an emitter coupled to the positive terminal of the full-wave rectifier 2 drives the electromagnetic coil 4. One terminal of the electromagnetic coil 4 is coupled to the collector of the transistor 3, while the other terminal thereof is grounded. The electromagnetic coil 4 is energized and de-energized by turning on and off the transistor 3. The electromagnetic coil 4 is de-energized to trip the circuit breaker (not shown) when the controlled voltage $V_0$ becomes less than the predetermined level. The circuit breaker associated with the electromagnetic coil 4 can be made only when the electromagnetic coil 4 is energized. The circuit breaker cannot be made when the electromagnetic coil 4 is de-energized.

The gate of an N-gate thyristor 5 coupled in series with a resistor $R_1$ across the full-wave rectifier 2 is controlled by a voltage at a middle point A of the voltage divider consisting of a resistor $R_2$ and a variable resistor $R_3$. A Zener diode 6 is coupled across the N-gate thyristor 5 in opposite polarity. The gate of a P-gate thyristor 7 coupled in series with a resistor $R_4$ across the full-wave rectifier 2 is controlled through a Zener diode 9 by the voltage at the middle point B of the voltage divider consisting of a resistor $R_5$ and a variable resistor $R_6$. Further, a capacitor 8 is coupled across the anodes of the N-gate thyristor 5 and P-gate thyristor 7. A resistor $R_7$ connects the anode of the P-gate thyristor 7 and the point B coupled to the base of the transistor 3.

The operation of the circuit of FIG. 3 is as follows. Before the voltage is supplied from the controlled power source 1, the P-gate thyristor 7 is turned off. Thus, so long as the controlled voltage $V_0$ is low, the base voltage of the transistor 3 remains at the high level, such that the transistor 3 remains turned off. The electromagnetic coil 4 is thus de-energized and the circuit breaker is tripped and is incapable of being made.

When the controlled power source 1 is normal and the controlled voltage $V_0$ rises above a first minimum excitation voltage level, the voltage at the divider point B rises above the Zener voltage of the Zener diode 9 to turn on the Zener diode 9, thereby turning on the P-gate thyristor 7. The base voltage of the transistor 3 is thus reduced through the resistor $R_7$, and the transistor 3 is turned on to energize the electromagnetic coil 4. The circuit breaker associated with the electromagnetic coil 4 thus becomes capable of being made. The first minimum excitation voltage level for turning on the electromagnetic coil 4 can be set by adjusting the voltage at the divider point B by means of the variable resistor $R_6$.

When the P-gate thyristor 7 is turned on, the N-gate thyristor 5 is forcibly turned off by the commutation current of the capacitor 8. The P-gate thyristor 7 remains turned off until the controlled voltage $V_0$ falls below a second minimum excitation voltage level. When the controlled voltage $V_0$ falls below the second minimum excitation voltage level, the voltage at the divider point A coupled to the gate of the N-gate thyristor 5 becomes less than the voltage of the Zener diode 6, namely, the voltage at the anode of the N-gate thyristor 5. As a result, the N-gate thyristor 5 is turned on, and the commutation current from the capacitor 8 turns off the P-gate thyristor The transistor 3 is thus turned off and the electromagnetic coil 4 is de-energized, such that the circuit breaker is tripped and becomes incapable of being made.

By the way, the second minimum excitation voltage level for triggering the tripping operation in the case of abnormally low voltage is set lower than the first minimum excitation voltage level such that the circuit exhibits hysteresis and the operation is stabilized. When the controlled voltage $V_0$ rises above the first minimum excitation voltage level again, the electromagnetic coil 4 is again energized as described above.

The above trip control device for a circuit breaker, however, has the following disadvantage. The circuit breaker is tripped (i.e., rendered incapable of being made) only when an abnormal low level of the controlled voltage $V_0$ is detected. Thus, in the case where an overvoltage exceeding the maximum allowable level is applied to the circuit breaker due to the misconnection of the controlled power source 1, etc., the circuit breaker is not tripped and remains capable of being made. As a result, depending on the load connected to the circuit breaker, the destruction of expensive equipment or a grave failure accident such as fire may ensue.

SUMMARY OF THE INVENTION

It is therefore an object of this invention to provide a trip control device for a circuit breaker, using a single electromagnetic coil, which is capable of tripping the circuit breaker upon detection of overvoltage as well as upon detection of abnormally low level.

The above object is accomplished in accordance with the principle of this invention by a trip control device for a circuit breaker, which comprises an electromagnetic coil which is energized to render a circuit breaker capable of being made when a voltage applied thereacross exceeds a minimum excitation voltage level; a drive circuit for selectively energizing and de-energizing the electromagnetic coil, the drive circuit energizing the electromagnetic coil when turned on, and de-energizing the electromagnetic coil when turned off; and voltage detector means for detecting a controlled voltage and for turning off the drive circuit when the controlled voltage exceeds a maximum allowable voltage level, and turning on the drive circuit when the controlled voltage falls from the maximum allowable voltage level to an operation resumable level.

Preferably, the voltage detector means comprises: a first voltage detector for detecting a first reference voltage corresponding to the maximum allowable voltage level, the first voltage detector outputting a first signal at logical level 1 when the controlled voltage exceeds the first reference voltage; a second voltage detector for detecting a second reference voltage corresponding to the operation resumable level, the second voltage detector outputting a second signal at logical level 1 when the controlled voltage exceeds the second reference voltage, and at logical level 0 when the controlled voltage falls below the second reference voltage, wherein the second reference voltage is higher than the first reference voltage; means, coupled to the second voltage detector, for reducing the first signal to logical level 0 upon receiving the second signal at logical level 1; and a logical OR circuit for generating a logical sum of an output of the first voltage detector and an output of the second voltage detector, the logical sum turning off the drive circuit when at logical 1 and turning on the drive circuit when at logical level 0.

It is further preferred that the reducing means includes means for delaying reducing operation for a predetermined time length upon receiving the second signal at logical level 1.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENT

Referring now to the accompanying drawings, the preferred embodiment of this invention is described.

Figure 1:
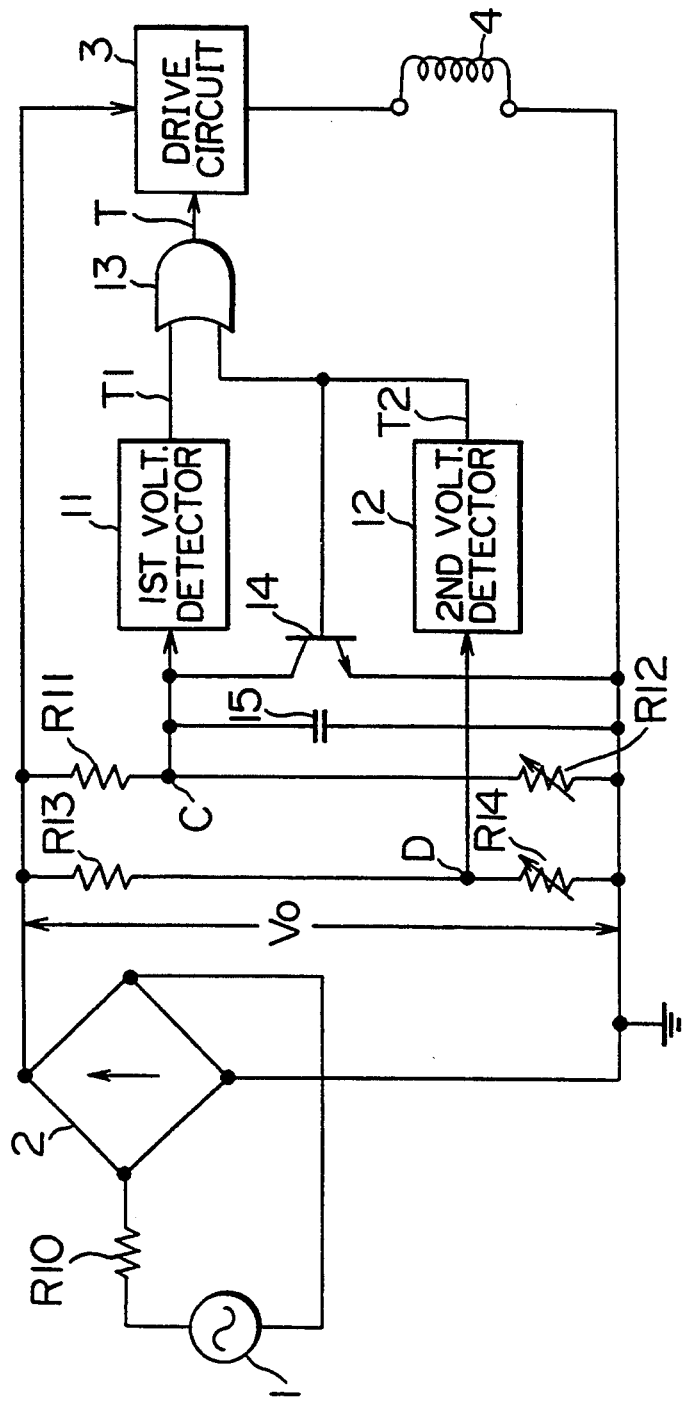
FIG. 1 a circuit diagram showing a trip control device according to this invention.
Figure 3:
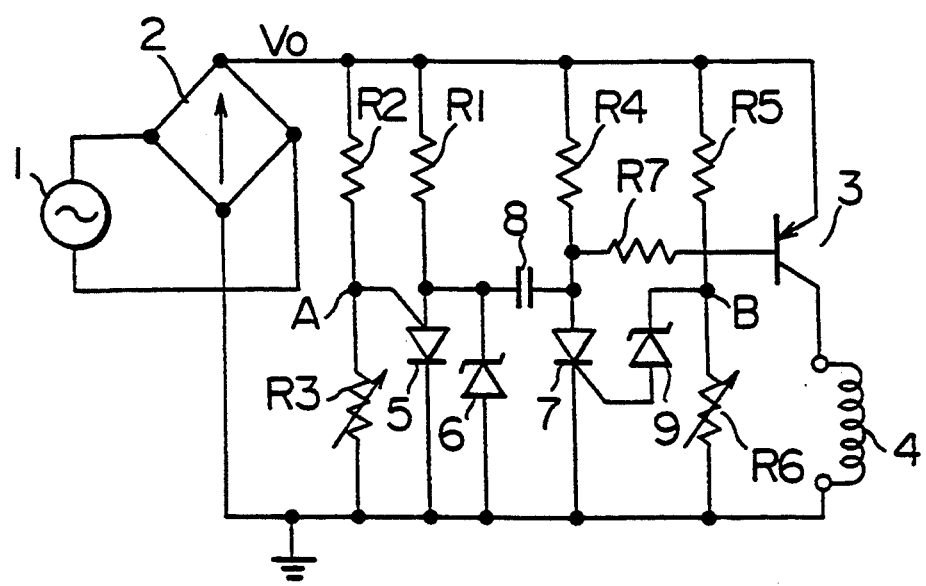
FIG. 3 is a circuit diagram showing a conventional trip control device.

FIG. 1 is a circuit diagram showing a trip control device according to this invention. The parts 1 through 4 are similar to the corresponding parts 1 through 4 in FIG. 3. Thus, the drive circuit 3 consists of a transistor and selectively energizes and de-energizes the electromagnetic coil 4. The drive circuit 3 is conducting (turned on) at the initial state before the voltage is supplied. Thus, the electromagnetic coil 4 is automatically energized and renders the associated circuit breaker capable of being made when the controlled voltage $V_0$ exceeds a minimum excitation voltage level.

A resistor $R_{10}$ is inserted between the controlled power source 1 and an input terminal of full-wave rectifier 2. The resistor $R_{10}$ may be omitted when the same function is provided by the impedance within the controlled power source 1.

The voltage divider consisting of a resistor $R_{11}$ and a variable resistor $R_{12}$ and coupled across the output terminals of the full-wave rectifier 2 provide a first divider voltage at point C for detecting the first reference voltage $V_1$ corresponding to the maximum allowable voltage level of the controlled voltage $V_0$. Similarly, the voltage divider consisting of a resistor $R_{13}$ and a variable resistor $R_{14}$ and coupled across the output terminals of the full-wave rectifier 2 provide a second divider voltage at point D for detecting the second reference voltage $V_2$ corresponding to the operation resumable level of the controlled voltage $V_0$.

A first voltage detector 11 detects the voltage at the divider point C and outputs a high level signal T1 (at the logical level 1) when the controlled voltage $V_0$ exceeds the first reference voltage $V_1$ to raise the voltage at point C above the threshold voltage level thereof. A second voltage detector 12 detects the voltage at the divider point D and outputs a high level signal T2 (at the logical level 1) when the controlled voltage $V_0$ exceeds the second reference voltage $V_2$ to raise the voltage at point D above the threshold voltage level thereof. The output signal T2 of the second voltage detector 12 is reduced to the low level (logical level 0) when the controlled voltage $V_0$ falls below the second reference voltage $V_2$.

An OR gate 13 generates the logical sum of the outputs T1 and T2 of the first voltage detector 11 and the second voltage detector 12. Thus the trip signal T output from the OR gate 13 is at the high level when either the signal T1 or T2 is at the high level. The transistor 3 is turned on and off by the trip signal T.

A NPN type transistor 14 is coupled across the variable resistor $R_{12}$. The emitter of the transistor 14 is grounded, while the output signal T2 from the second voltage detector 12 is applied to the base thereof. Thus, the transistor 14 is turned on when the output T2 is at the high level, thereby grounding the point C. Then, the output T1 of the first voltage detector 11 is reduced to the low level. Further, a capacitor 15 coupled across the variable resistor $R_{12}$ prevents abrupt rise of voltage at point C when the controlled voltage $V_0$ returns to operation resumable level and the transistor 14 is turned off.

The electromagnetic coil 4 exhibits a predetermined impedance, and the serial circuit of the impedance of the controlled power source 1 or that of the resistor $R_{10}$ and the impedance of the electromagnetic coil 4 determines the controlled voltage $V_0$ developed across the electromagnetic coil 4 or the output terminals of the full-wave rectifier 2. The controlled voltage $V_0$ is applied across the voltage divider consisting of the resistors $R_{11}$ and $R_{12}$ to develop a corresponding voltage at point C, and across the voltage divider consisting of the resistors $R_{13}$ and $R_{14}$ to develop a corresponding voltage at point D.

Figure 2:
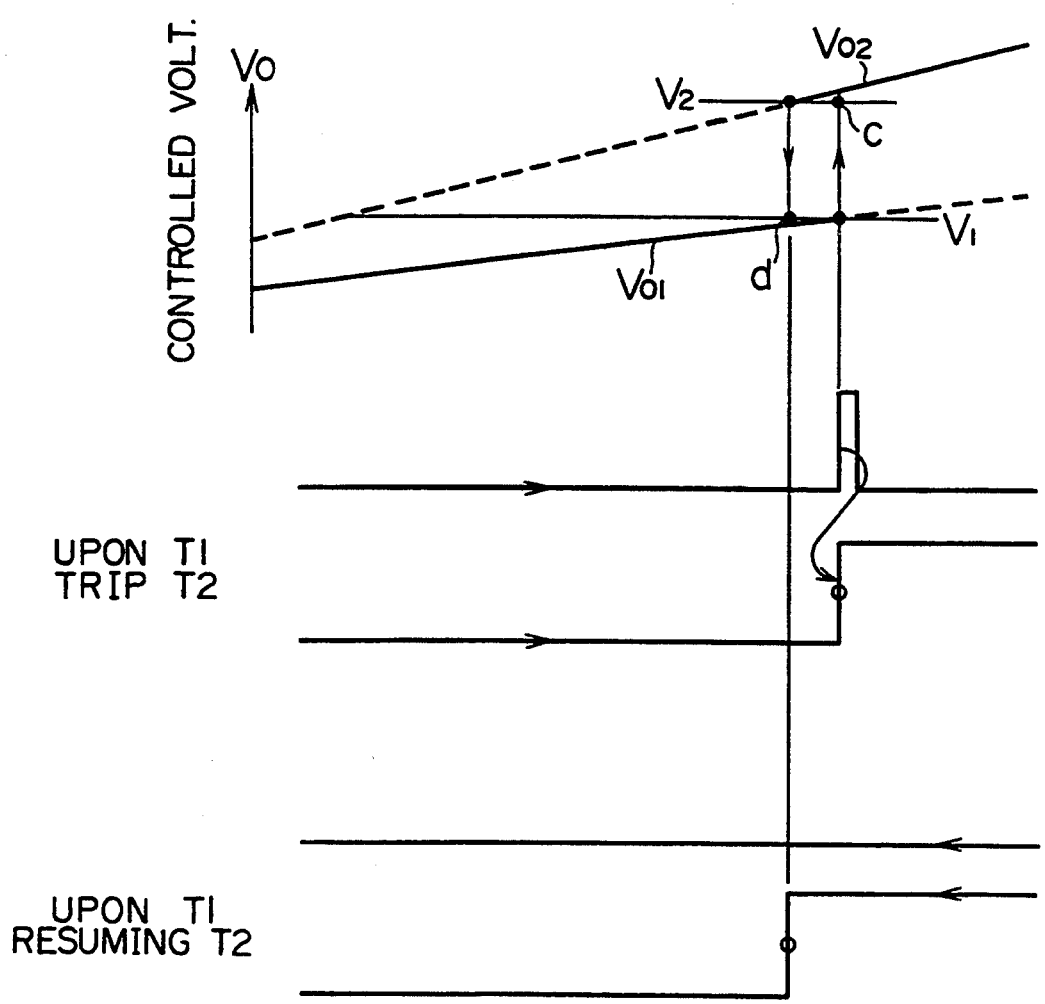
FIG. 2 shows the controlled voltage level (at the top) and signal waveforms T1 and T2 in the circuit of FIG. 1 upon tripping (at the middle) and upon resuming operation (at the bottom)

Next the operation of the circuit of FIG. 1 is described. FIG. 2 shows the controlled voltage level (at the top) and signal waveforms T1 and T2 in the circuit of FIG. 1 upon tripping (at the middle) and upon resuming operation (at the bottom). The operation of the circuit of FIG. 1 up to the point when the electromagnetic coil 4 is de-energized to trip the associated circuit breaker (rendering it incapable of being made) is as follows.

Before the voltage is supplied from the controlled power source 1, the voltages at the divider points C and D are both low and thus the outputs T1 and T2 of the first voltage detector 11 and the second voltage detector 12 are both at the low level. Consequently, the trip signal T output from the OR gate 13 is also at the low level, and the transistor 3 is turned on and conducting.

Thus when the controlled voltage $V_0$ exceeds the minimum excitation voltage level, the electromagnetic coil 4 is energized to render the associated circuit breaker capable of being made. Usually, the minimum excitation voltage level is at about 80 percent of the rated voltage with respect to the source voltage of the controlled power source 1.

The controlled power source 1 is placed under normal load condition when the transistor 3 is turned on and the electromagnetic coil 4 is energized. Assume that the controlled voltage under the normal load condition rises gradually as shown at $V_{01}$ at the top in FIG. 2. When the controlled voltage $V_{01}$ under normal load reaches and exceeds the first reference voltage $V_1$ corresponding to the maximum allowable voltage level, the voltage at the point C rises above a threshold level of the first voltage detector 11, and the output T1 of the first voltage detector 11 rises to the high level. Thereupon the trip signal T output from the OR gate 13 also rises to the high level to turn off the transistor 3. The first reference voltage $V_1$ corresponding to the maximum allowable voltage level is at about 125 percent of the rated voltage with respect to the source voltage. The voltage at divider point C for detecting the first reference voltage $V_1$ is adjusted by the variable resistor $R_{12}$.

The electromagnetic coil 4 is thus de-energized and the controlled power source 1 transits to the light load condition. As a result, the controlled voltage rises abruptly toward point c as shown by an upward vertical arrow in FIG. 2. The controlled voltage under the light load is represented by $V_{02}$ in FIG. 2. When the controlled voltage thus reaches the second reference voltage $V_2$ at the point c in FIG. 2 immediately before the completion of the voltage jump due to the change in the load, the voltage at the point D rises above the threshold level of the second voltage detector 12 and the output T2 of the second voltage detector 12 rises to the high level.

The high level signal T2 maintains the output T of the OR gate 13 at the high level, and, at the same time, the high level signal T2 turns on the transistor 14 and thereby grounds the point C coupled to the input of the first voltage detector 11. As a result, the output T1 of the first voltage detector 11 is reduced to the low level. Under this circumstance, the output T of the OR gate 13 is maintained at the high level exclusively due to the high level of the output T2 of the second voltage detector 12 and thus keeps the electromagnetic coil 4 de-energized. Thus, the voltage detector circuit is in the "resumable level detection mode" for detecting the resumable level, as described in detail below. After the jump upon the controlled voltage exceeding the first reference voltage $V_1$, the controlled voltage $V_{02}$ under light load may continue to rise as shown in FIG. 2.

Next the resuming operation of the circuit of FIG. 1 is described. Assume that the controlled voltage under light load $V_{02}$ falls to the second reference voltage $V_2$, moving along the curve $V_{02}$ toward left as represented in FIG. 2. Then, the voltage at point D falls below the threshold level of the second voltage detector 12 and the output T2 thereof returns to the low level, thereby reducing the output T of the OR gate 13 also to the low level. The transistor 3 is thus turned on and the electromagnetic coil 4 is energized to render the circuit breaker capable of being made. The second reference voltage $V_2$ corresponding to the resumable voltage level is set at 120 percent of the rated voltage with respect to the source voltage. The voltage at the divider point D for detecting the second voltage $V_2$ is adjusted by the variable resistor $R_{14}$. For the purpose of ensuring stable tripping and resuming operation, the reference voltages for the two operations are designed to exhibit hysteresis of five percent.

When the transistor 3 is turned on and the electromagnetic coil 4 is energized, the controlled power source 1 is again under the normal load and the controlled voltage falls abruptly toward point d as shown by the downward vertical arrow in FIG. 2. At the same time, the transistor 14 is turned off, such that the proper voltage at the divider point C is applied to the input of the first voltage detector 11. However, the output T1 remains at the low level since the controlled voltage falls below the first reference voltage $V_1$.

Further, although the voltage at the point C begins to rise immediately after the transistor 14 is turned off, there is a rise delay due to the charging of the capacitor 15. Thus, provided that the rise delay of the voltage at the point C due to the capacitor 15 is designed of a sufficient length for covering the time interval in which the controlled voltage $V_{02}$ under the light load falls to the controlled voltage $V_{01}$ (at point d) under the normal load, the voltage at point C after the controlled voltage $V_{01}$ settles to the point d is applied to the first voltage detector 11. Then, the unstable operation caused by the erroneous detection above the first voltage $V_1$ by the first voltage detector 11 immediately after the detection of the second voltage $V_2$ by the second voltage detector 12 can be prevented.

As described above, the controlled voltage varies in accordance with the variation of the load, from the first state where only the impedance of the resistor $R_{10}$ is coupled across the controlled power source 1, to the second state where both the impedances of the resistor $R_{10}$ and the electromagnetic coil 4 are coupled across the controlled power source 1. In accordance with the principle of this invention, this variation of the controlled voltage is exploited to detect the source voltage level accurately with a simple circuit structure.

Further, the electromagnetic coil 4 is automatically de-energized when the controlled voltage $V_0$ falls below the minimum excitation voltage level. Thus, the trip control device according to this invention can effect the trip operation of the circuit breaker at the minimum excitation voltage level as well. Furthermore, when the circuit breaker is tripped upon detection of the first voltage $V_l$, the controlled voltage rises abruptly from the controlled voltage under normal load $V_{01}$ to the controlled voltage under light load $V_{02}$. Thus the margin for the detection of second voltage $V_2$ is increased, and stable on/off operation of the transistor 3 and the electromagnetic coil 4 is ensured.

By the way, although the controlled power source 1 in the above embodiment is an AC power source, the power source may also be a DC power source. Furthermore, the apparatus controlled by the trip control device according to this invention may be an apparatus other than a circuit breaker, provided that the apparatus can be made (closed) and tripped (rendered incapable of being made).

Further, the electromagnetic coil 4 may be replaced by a device exhibiting a predetermined impedance, such as an input transformer of a power source. Furthermore, in the case of the above embodiment, the power is supplied directly from the controlled power source 1.

However, the power may be supplied through a transformer. In such case, the impedance of the transformer may serve as the resistor $R_{10}$, and the resistor $R_{10}$ may hence be omitted.

What is claimed is:

1. A trip control device for a circuit breaker, comprising:

an electromagnetic coil which is energized to render a circuit breaker capable of being made when a voltage applied thereacross exceeds a minimum excitation voltage level;

a drive circuit for selectively energizing and de-energizing said electromagnetic coil, said drive circuit energizing said electromagnetic coil when turned on, and de-energizing said electromagnetic coil when turned off;

voltage detector means for detecting a controlled voltage and for turning off said drive circuit when said controlled voltage exceeds a maximum allowable voltage level, and turning on said drive circuit when said controlled voltage falls below an operation resumable level;

wherein said voltage detector means compromises:

a first voltage detector for detecting a first reference voltage corresponding to said maximum allowable voltage level, said first voltage detector outputting a first signal at logical level 1 when said controlled voltage exceeds said first reference voltage;

a second voltage detector for detecting a second reference voltage corresponding to said operation resumable level, said second voltage detector outputting a second signal at logical level 1 when said controlled voltage exceeds second reference voltage, and at logical level 0 when said controlled voltage falls below said second reference voltage, wherein said second reference voltage is higher than said first reference voltage;

reducing means, coupled to said second voltage detector, for reducing said first signal to logical level 0 upon receiving said second signal at logical level 1; and a logical OR circuit for generating a logical sum of said first voltage detector and an output of said second voltage detector, said logical sum turning off said drive circuit when at logical 1 and turning on said drive circuit when at logical level 0.

2. A trip control device as claimed in claim 1, wherein said reducing means includes means for delaying a detection of first reference voltage for a predetermined delay time from a time point at which said second signal changes from logical level 1 to logical level 0.

* * * * *